(12) United States Patent
Lee et al.

(10) Patent No.: US 6,893,710 B2
(45) Date of Patent: May 17, 2005

(54) MULTILAYER CERAMIC COMPOSITION

(75) Inventors: Wen-Hsi Lee, Kaohsiung (TW); Che-Yi Su, Kaohsiung (TW); Yi-Jung Ling, Kaohsiung (TW)

(73) Assignee: Yageo Corporation, Taipei Hsien (TW)

( * ) Notice: Subject to any disclaimer, the term of this patent is extended or adjusted under 35 U.S.C. 154(b) by 0 days.

(21) Appl. No.: 10/420,114

(22) Filed: Apr. 18, 2003

(65) Prior Publication Data

US 2004/0209055 A1 Oct. 21, 2004

(51) Int. Cl.$^7$ .............. B32B 3/00; H01G 4/06
(52) U.S. Cl. .............. 428/210; 361/321.4; 361/321.5; 361/321.3; 361/321.1
(58) Field of Search .............. 428/210; 361/321.3, 361/321.4, 321.5, 321.1, 321.2

(56) References Cited

U.S. PATENT DOCUMENTS

| | | | |
|---|---|---|---|
| 4,567,542 A | * | 1/1986 | Shimada et al. ......... 361/321.4 |
| 4,650,923 A | | 3/1987 | Nishigaki et al. |
| 4,654,095 A | | 3/1987 | Steinberg |
| 4,766,027 A | * | 8/1988 | Burn ................. 428/210 |
| 5,085,720 A | | 2/1992 | Mikeska et al. |
| 5,384,434 A | * | 1/1995 | Mandai et al. .......... 174/258 |
| 5,757,611 A | | 5/1998 | Gurkovich et al. ...... 361/321.4 |
| 6,055,151 A | | 4/2000 | Tormey et al. |

FOREIGN PATENT DOCUMENTS

| | | |
|---|---|---|
| CN | 405330 | 9/2000 |
| CN | 495774 | 7/2002 |
| EP | 1 003 216 A2 | 5/2000 |
| EP | 1 033 749 A2 | 9/2000 |

\* cited by examiner

*Primary Examiner*—Cathy Lam
(74) *Attorney, Agent, or Firm*—Merchant & Gould P.C.

(57) ABSTRACT

The present invention provides a multilayer ceramic composition comprising at least one layer of dielectric material $M_1$ and at least one layer of dielectric material $M_2$, wherein passive components are buried in both layers of dielectric material $M_1$ and $M_2$ that prevent each other from shrinkage in the X and Y dimensions during firing. Each layer of the multilayer ceramic composition according to the invention can be used as a substrate for burying the passive component and has the ability to prevent other layer with different dielectric constant from shrinkage. Hence, the multilayer ceramic composition has the advantages of smaller size and a better circuit precision.

4 Claims, 2 Drawing Sheets

MULTILAYER CERAMIC COMPOSITION

BACKGROUND OF THE INVENTION

1. Field of the Invention

The invention relates to a ceramic composition, more particularly, to a multilayer ceramic composition for the performance of an electronic microwave system.

2. Description of the Related Art

Interconnect circuit boards are necessary for modern electronic products to meet the requirement of being light, thin and small. The interconnect circuit boards are either electronic circuits interconnecting each other electrically or mechanically, or subsystems such as a number of extremely small passive components and metalization patterns combined in an arrangement. Such passive components and metalization patterns can be physically isolated and buried adjacent to one another in a single interconnect circuit board to electrically connect to each other and/or extend from the interconnect circuit board thereby. Nowadays, ceramic compositions are usually applied for the interconnect circuit board.

In the ceramic composition, complex electronic circuits generally require several insulating dielectric layers to separate layers of conductors. Meeting the requirement of different dielectric constants (K) suitable for fabricating or burying passive components and metalization patterns, a series of dielectric material with different dielectric constants are needed. For example, a low dielectric constant material is preferred in a signal processing portion of the ceramic composition to improve the speed at which the signals therein are propagated to provide fast processing; and a high dielectric constant material is preferred in fabricating capacitors as a buried passive component. The electrically conductive pathways interconnecting the passive components and metalization patterns through the dielectric layers are called vias. Such a multiplayer structure allows a circuit to be more compact and occupy less space.

The method for co-firing a multiplayer ceramic composition on which passive components and metalization patterns such as resistors, capacitors, or conductors have been printed with metallized vias extending through the dielectric layers to interconnect various passive components and metalization patterns, is described in U.S. Pat. No. 4,654,095 incorporated herein for reference. The ceramic powder can densify at temperatures that are compatible with the use of high conductivity metallizations such as gold, silver, and copper. In particular, densification is achieved at or below 1000° C. in order to provide a margin of error sufficiently distant from the melting point of gold, 1060° C. The dielectric layers are stacked in registry and pressed together at a proper temperature and pressure, and then fired to drive off the organics such as binders and plasticizers in the green ceramic body. All the ceramic and heterogeneous materials are sintered and densified thereby. This method has the advantages of performing firing only once, saving fabricating time and labor, and limiting the diffusion of mobile metals to prevent shorting between the conductive layers.

However, co-firing a monolithic structure having a high K dielectric and a low K dielectric material has problems. One of the problems is the changes of electric properties and the other is shrinking mismatch occurring during firing.

In the respect of the changes of electric properties, many conventional assembles utilize a low dielectric constant material and a high dielectric constant material, the low dielectric constant material containing a glass resulting in increased dielectric constant and increased losses, and the high dielectric constant material containing lead, magnesium and niobium. However, chemical reactions take place when a low dielectric material and a high dielectric material are in contact at temperatures above 800° C. during the co-firing process due to interface diffusion. For this reason, the dielectric constants of both low and high dielectric constant materials are both changed. Usually, a dramatic drop of the high dielectric constant material happens.

Several buffer layers interposed between a low and a high dielectric constant materials of a electronic package are disclosed in U.S. Pat. No. 5,757,611. The buffer layers containing 25 to 100% barium compound provide an additional physical barrier during the initial stages of densification by creating a more difficult path for chemical diffusion. Vias can also be formed through the buffer layers for electrical conducting a passive component portion and a signal processing portion. The glass forming additives and inorganic fillers controls the shrinkage rate, thermal expansion and chemical compatibility of the buffer layer in contact with either the high K dielectric layers of the passive component portion or the is low K dielectric layers of the signal processing portion. On the other hand, the buffer layer enlarges the thickness of the electronic package, and thus cannot serve as a good substrate for burying passive components, either.

Other multilayer ceramic green tape structure with different K is shown in U.S. Pat. No. 6,055,151, which focuses on inks screen printed onto low firing temperature green tapes to form embedded components such as capacitors to tight tolerances with high precision placement. The capacitor layer is sandwiched between two barium titanate barrier layers having a thickness sufficient to prevent diffusion of the low firing temperature glass of the green tapes. Furthermore, the multilayer ceramic green tape structure is bonded on a metal support substrate by bonding glass to prevent shrinkage. However, the shrinkage rates of the low firing temperature green tapes and the metal support substrate are different, and should be well controlled during firing to avoid fracture occurring. Besides, the thickness of the multilayer ceramic green tape structure still cannot be reduced.

In the respect of the shrinkage, because the shrinkages of elements when sintering are not the same, the firing condition is difficult to control. Furthermore, this uncertainty in the X and Y dimensions resulting in misregistration during assembly of large and complex circuits is particularly undesirable. A method for reducing shrinkage during firing of green ceramic bodies is disclosed in U.S. Pat. No. 5,085,720. Each of the top and bottom of the green ceramic body is applied with a release layer to form a "sandwich" structure. During burning out and sintering, a unidirectional pressure is applied to the surface of the release layer. The porosity of the release layer provides an escape pathway for the volatile components of the green ceramic body. Because the release layer does not shrink in firing, the shrinkage in the X and Y dimensions of the green ceramic body is reduced. On the other hand, the release layers covering both the top and bottom surfaces of the green ceramic body, their removal should be performed after sintering for printing with and firing the conductors, resistors, and capacitors thereon. The cost of the method thus rises. When fabricating a large number of ceramic layers (e.g. more than 6 layers), middle layers of a green ceramic body still shrink as the result of the forces not being distributed evenly by applying the release layers on the top and bottom of the green body (i.e. the forces on the top and the bottom and on the middle layers of the green body are substantially different).

Some modifications of the green ceramic bodies disclosed in U.S. Pat. No. 5,085,720 had been made, in which a constraining layer for preventing shrinkage is set between the layers of a green ceramic body. The constraining layer remains in the final product preventing the disadvantage of removal. However, the constraining layer cannot be as a proper dielectric material; the thickness of the product is therefore enlarged.

In order to resolve the problems mentioned above, the present invention develops a novel multilayer ceramic composition that has the advantages of downsizing and a better circuit precision by reducing shrinkage in the X and Y dimensions when co-firing two dielectric materials with different dielectric constants and passive components buried therein.

SUMMARY OF THE INVENTION

The present invention provides a multilayer ceramic composition comprising at least one layer of dielectric material $M_1$ and at least one layer of dielectric material $M_2$, wherein passive components are buried in both layers of the dielectric material $M_1$ and $M_2$ that prevent each other from shrinkage in the X and Y dimensions during firing. Each layer of the multilayer ceramic composition according to the invention can be used as a substrate for burying the passive component and has the ability to prevent other layer with different dielectric constant from shrinkage. Hence, the multilayer ceramic composition has the advantages of downsizing and a better circuit precision.

One object of the invention is to provide a multilayer ceramic composition comprising:

at least one layer of dielectric material $M_1$ with a dielectric constant of $K_1$ having at least one buried passive component therein; and at least one layer of dielectric material $M_2$ with a dielectric constant of $K_2$ having at least one buried passive component therein, which is set under the layer of dielectric material $M_1$;

wherein $K_1$ differs from $K_2$, and the layer of dielectric material $M_1$ and the layer of dielectric material $M_2$ prevent each other from shrinkage in the X and Y dimensions during firing.

DETAILED DESCRIPTION OF THE INVENTION

The invention provides a multilayer ceramic composition comprising:

at least one layer of dielectric material $M_1$ with a dielectric constant of $K_1$ having at least one buried passive component therein; and at least one layer of dielectric material $M_2$ with a dielectric constant of $K_2$ having at least one buried passive component therein, which is set under the layer of dielectric material $M_1$;

wherein $K_1$ differs from $K_2$, and the layer of dielectric material and the layer of dielectric material $M_2$ prevent each other from shrinkage in the X and Y dimensions during firing.

Figure 1:
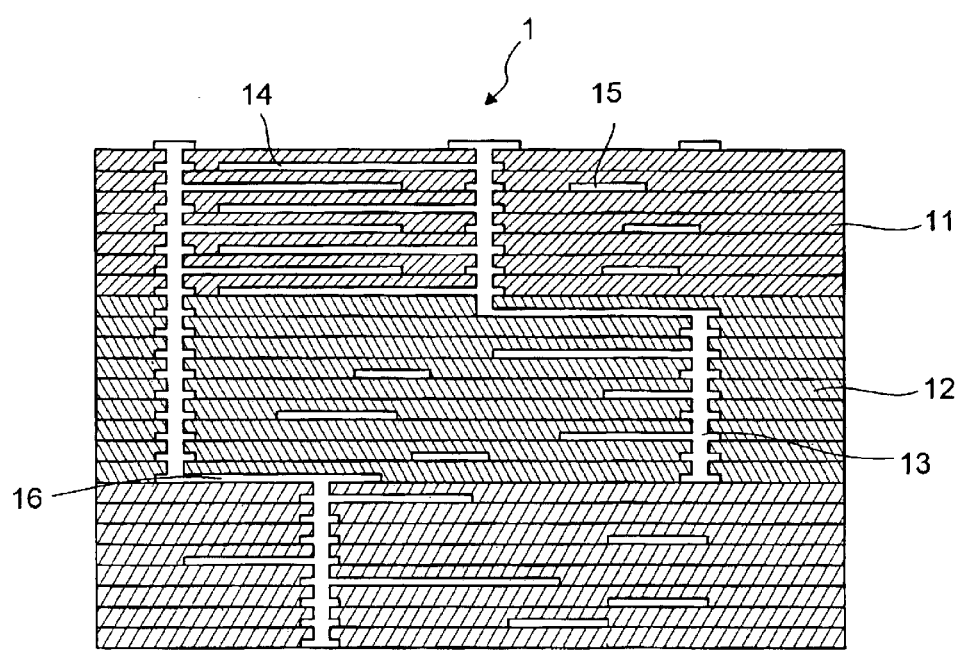
FIG. 1 illustrates schematic section of one embodiment of a multilayer ceramic composition according to the invention.

The embodiment of the multilayer ceramic composition 1 according to the present invention shown in FIG. 1 includes a plurality of layers of dielectric material $M_1$ 11 with the dielectric constant of $K_1$, and a plurality of layers of dielectric material $M_2$ 12 with the dielectric constant of $K_2$. $K_1$ differs from $K_2$. Both of the layers of dielectric material $M_1$ 11 and the layers of dielectric material $M_2$ 12 can be used as substrates for burying passive components 15. Preferably, metallization patterns 16 are created by applying selected amounts of conductive metals in a selected pattern upon the layers of dielectric material $M_1$ 11 and the layers of dielectric material $M_2$ 12. A number of vias may also be punched through the layers 11, 12, which may be openings through the layers 11, 12 and via conductors 13 may be placed within the vias to electrically couple the passive components 15 and the metallization patterns 16.

In a preferred embodiment of the present invention, the ceramic composition further comprises an overlying dielectric layer that has no passive components or metallization patterns printed thereon.

As used herein, the term "buried passive component" refers to a buried passive component fabricated and an electric component made from dielectric layers and metallization patterns and/or via conductors. For example, the fabricated passive component includes capacitor, resistor, and inductor. In particular, the metallization pattern 16 within the layers 11 or 12 may include multiple opposite oriented electrodes 14 together with the layers 11 or 12 to form a capacitor. The metallization patterns 16 between the layers 1 or 12 to form various signal processing devices such as transmit/receive (T/R) modules and the like.

The metallization patterns 16 and via conductors 13 preferably include highly conductive materials such as gold, silver, copper and alloys thereof, and wherein more preferably silver, which has a melting temperature of 960° C. is included. Therefore, densification of the multilayer ceramic composition 1 must be achieved at temperatures below the melting point of the particular conductive material forming the metallization patterns 16. Furthermore, for different designs of circuit, materials with different dielectric constants are needed.

Dielectric materials that can be used to manufacture the dielectric layers according to the invention are suitable to be used as $M_1$ and $M_2$. According to a preferred embodiment of the invention, at least one of the materials $M_1$ and $M_2$ comprises ceramic solids and inorganic glass providing suitable electric properties.

As used herein, the term "ceramic solids" refers to a composition which is not directly critical so long as the solids are chemically inert with respect to the other materials in the system and have the following physical properties relative to other components of the dielectric material system: (1) they have sintering temperatures well above the sintering temperatures of the inorganic glass, and (2) they do not undergo sintering during the firing step of the invention. The examples of the ceramic solids include inorganic metals, high melting inorganic solids, and high softening point glasses. In a more preferred embodiment, the ceramic includes barium titanium oxide, barium samarium neodymium titanium oxide, silicon oxide, aluminum oxide, magnesium aluminum silicon oxide, and the mixture thereof.

Moreover, the ceramic solids may be chosen on the basis of both its dielectric and thermal expansion properties. Thus, mixtures of such materials may be selected in order to match the thermal expansion characteristics of any substrate to which they are applied.

As used herein, the term "inorganic glass" refers to an inorganic material which is chemically inert with respect to the other materials in the system and has the following appropriate physical properties: (1) it has a sintering temperature well below that of the ceramic; and (2) it undergoes viscous flow sintering at the firing temperatures used. The inorganic glass suitable for the invention is usually glass, particularly crystallized or non-crystallized glass in firing. In a more preferred embodiment, the inorganic glass is selected from the group consisting of bismuth oxide, tellurium oxide, boron oxide, the precursor thereof, and the mixture thereof in an amount ranging from about 0.5 to about 98 wt %.

The ceramic solid and inorganic glass are dispersed in a polymeric binder. The polymeric binder optionally has dissolved therein other materials such as plasticizers, release agents, dispersing agents, stripping agents, antifoaming agents and wetting agents. Any polymeric binder known in the art useful for producing low-temperature co-firing ceramic is suitable for use in the present invention.

Combining the ceramic solids and the inorganic glass, a series of materials with different dielectric constants and sintering temperatures are obtained. Preferably, the dielectric constant of the dielectric materials according to the invention ranges from about 4 to about 2000. In another aspect, the sintering temperature of the dielectric materials according to the invention ranges from about 450° C. to about 1200° C., and wherein more preferably, the sintering temperature is below about 960° C. for co-firing with silver in the ceramic composition.

According to the invention, the layers of dielectric material $M_1$ and $M_2$ are located in contact with each other preventing shrinkage in the X and Y dimensions; all shrinkage therefore occurs in the Z direction. The mechanism of preventing shrinkage depends on the differences of sintering temperatures of the materials $M_1$ and $M_2$. For example, the sintering temperature of the dielectric material $M_1$ is $T_1$, and the sintering temperature of the dielectric material $M_2$ is $T_2$, wherein $T_1$ is larger than $T_2$. When the layers of dielectric material $M_2$ start to sinter at $T_2$, the shrinkage in the X and Y dimensions is inhibited and reduced by the layers of dielectric material $M_1$ which still do not shrink at $T_2$. At this moment, the layers of dielectric material $M_1$ play the role of constraining layer to inhibit the shrinkage of the layers of dielectric material $M_2$. When the temperature is raised to $T_1$, the layers of dielectric material $M_2$ have completed the sintering and do not shrink any more and thus the shrinkage in the X and Y dimensions of the layers of dielectric material $M_1$ is inhibited and reduced by the layers of dielectric material $M_2$. Preferably, $T_1$ is larger than $T_2+50°$ C. to achieve better effects of preventing shrinkage.

According to the present invention, bonding glass is optionally added between the layers of dielectric material $M_1$ and the layers of dielectric material $M_2$. The bonding glass can be used whether or not a force in the Z direction is applied during firing. The force is sufficient for the layers of the multiplayer ceramic composition to contact each other, and substantially results in all shrinkage occurring in the Z direction normal to the ceramic composition. That is, the X and Y dimensions of the ceramic composition do not shrink during firing. The bonding glass should be used when no pressure is applied. The bonding glass may be added to the $M_1$ and/or $M_2$ materials directly, or be in the form of a bonding glass layer presented between the layers of dielectric material $M_1$ and the layers of dielectric material $M_2$. The bonding glass layer is prepared by dissolving glass particles in a proper solvent as an ink, and printed on the layers of dielectric material $M_1$ and/or the layers of dielectric material $M_2$ by coating directly, spotter deposition or vapor deposition.

The present invention has many advantages. (1) Because every layer of the multilayer ceramic composition can be serve as a substrate for burying passive components without the need of buffer layers and/or barrier layers in the prior art, the total size of the ceramic composition is enormously reduced to meet the requirement of being light, thin and small for modern electronic products. (2) By the designs of the layers of two materials $M_1$ and $M_2$ preventing shrinkage of each other, no shrinkage occurs in the X and Y dimensions of the ceramic composition according to the invention. Therefore, the precision of circuit designed thereon is improved enormously, and the yield is raised thereby. (3) The cost is slashed in view of lack of buffer layer, barrier layer and/or metal support. (4) By combining the ceramic solids and inorganic glass, a series of materials with varieties of dielectric constant and quality factor are made thereby that can be applied for different purposes of electric properties.

The following examples are given for the purpose of illustration only but not intended to limit the scope of the present invention.

EXAMPLES 1 TO 15

Layers of Dielectric Materials

Material components of ceramic solids and inorganic glass as shown in Table 1 were mixed and polymeric binder and plasticizer were then added to form a ceramic slip. The ceramic slip was formed by passing the cast slurry under a blade with a thickness of about 50 $\mu$m. The sintering point (Ts), dielectric constant (K) and quality factor (Q) are also illustrated in Table 1.

TABLE 1

| Ex | inorganic glass (B) | ceramic solids (C) | B/C | Ts | K | Q |
|---|---|---|---|---|---|---|
| 1 | 87% $Bi_2O_3$-3% $B_2O_3$-10% $TeO_2$ | $Ba(SmNd)_2Ti_5O_{14}$ | 30/70 | 745 | 55 | 450 |
| 2 | 87% $Bi_2O_3$-3% $B_2O_3$-10% $TeO_2$ | $Ba(SmNd)_2Ti_5O_{14}$ | 50/50 | 632 | 40 | 320 |
| 3 | 87% $Bi_2O_3$-3% $B_2O_3$-10% $TeO_2$ | $Ba(SmNd)_2Ti_5O_{14}$ | 70/30 | 545 | 38 | 180 |
| 4 | 65% $Bi_2O_3$-2.5% $B_2O_3$-32.5% $TeO_2$ | $Ba(SmNd)_2Ti_5O_{14}$ | 65/35 | 635 | 37 | 250 |
| 5 | 65% $Bi_2O_3$-2.5% $B_2O_3$-32.5% $TeO_2$ | $Ba(SmNd)_2Ti_5O_{14}$ | 50/50 | 666 | 46 | 340 |
| 6 | 16% $Bi_2O_3$-14% $B_2O_3$-70% $TeO_2$ | $Ba(SmNd)_2Ti_5O_{14}$ | 20/80 | 680 | 65 | 421 |
| 7 | 16% $Bi_2O_3$-14% $B_2O_3$-70% $TeO_2$ | $Ba(SmNd)_2Ti_5O_{14}$ | 30/70 | 577 | 60 | 350 |
| 8 | 87% $Bi_2O_3$-3% $B_2O_3$-10% $TeO_2$ | $BaTiO_3$ | 65/35 | 677 | 850 | 150 |
| 9 | 87% $Bi_2O_3$-3% $B_2O_3$-10% $TeO_2$ | $BaTiO_3$ | 50/50 | 760 | 1100 | 175 |
| 10 | 65% $Bi_2O_3$-2.5% $B_2O_3$-32.5% $TeO_2$ | $BaTiO_3$ | 40/60 | 938 | 1500 | 230 |

TABLE 1-continued

| Ex | inorganic glass (B) | ceramic solids (C) | B/C | Ts | K | Q |
|---|---|---|---|---|---|---|
| 11 | 65% $Bi_2O_3$-2.5% $B_2O_3$-32.5% $TeO_2$ | $BaTiO_3$ | 65/35 | 834 | 700 | 145 |
| 12 | 65% $Bi_2O_3$-2.5% $B_2O_3$-32.5% $TeO_2$ | $SiO_2$ | 65/35 | 630 | 4 | 225 |
| 13 | 65% $Bi_2O_3$-2.5% $B_2O_3$-32.5% $TeO_2$ | $Al_2O_3$ | 65/35 | 710 | 5 | 350 |
| 14 | 65% $Bi_2O_3$-2.5% $B_2O_3$-32.5% $TeO_2$ | $3Al_2O_3 \cdot 2SiO_2$ | 65/35 | 675 | 4 | 320 |
| 15 | 65% $Bi_2O_3$-2.5% $B_2O_3$-32.5% $TeO_2$ | $Mg_2Al_4Si_5O_{18}$ | 65/35 | 665 | 3.5 | 250 |

EXAMPLE 16

Shrinkage Rate of the Multilayer Ceramic Composition

The dielectric layers according to Example 1 and layers of Du Pont 951 PT® were via punched, via filled and screen printed with a circuit. These layers were stacked and laminated at 4,000 psi and 60° C. for 10 minutes and fired. The shrinkage rate in the X and Y dimensions of ceramic composition with different ratios of the dielectric layers according to Example 1 and Du Pont 951 PTO layers were measured and are illustrated in FIG. 2.

Figure 2:
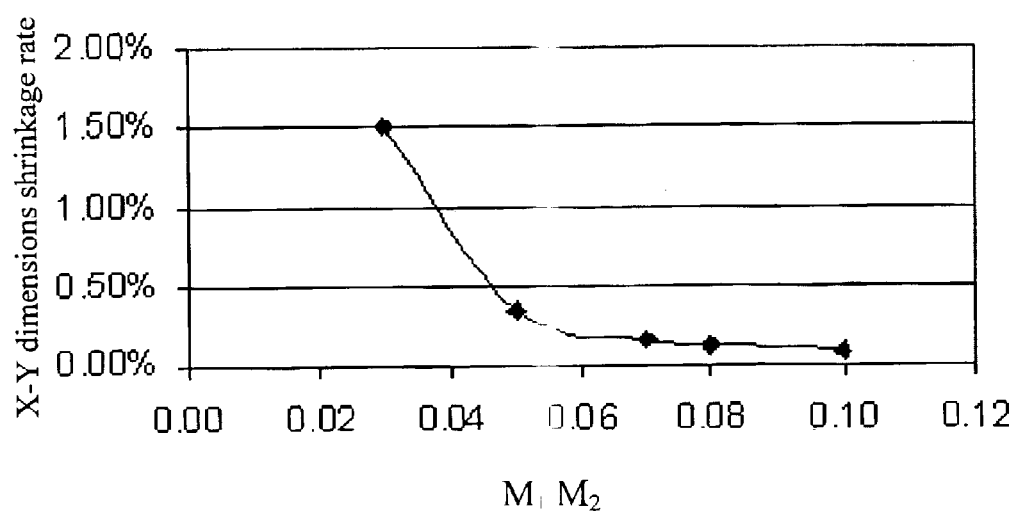
FIG. 2 illustrates the shrinkage rate measured when different thickness ratios of $M_1$ layer and $M_2$ layer are co-fired, wherein $M_1$ refers to the dielectric material according to Example 1, and $M_2$ refers to the conventional low-temperature co-fired ceramic (the product in the name of Du Pont 951 PT®).

As shown in FIG. 2, the shrinkage rates in the X and Y dimensions of the multilayer ceramic composition according to the invention were quite low showing that the layers of the two materials can prevent shrinkage of each other efficiently.

While embodiments of the present invention have been illustrated and described, various modifications and improvements can be made by persons skilled in the art. It is intended that the present invention is not limited to the particular forms as illustrated, and that all the modifications not departing from the spirit and scope of the present invention are within the scope as defined in the appended claims.

What is claimed is:

1. A multilayer ceramic composition comprising:
   at least one layer of dielectric material $M_1$ with a dielectric constant of $K_1$ and the sintering temperature of $T_1$ having at least one buried passive component therein; and
   at least one layer of dielectric material $M_2$ with a dielectric constant of $K_2$ and the sintering temperature of $T_2$ having at least one buried passive component therein, which is set under the layer of dielectric material $M_1$;
   wherein $K_1$ differs from $K_2$, $T_1 > T_2 + 50°$ C., and the layer of dielectric material $M_1$ and the layer of dielectric material $M_2$ prevent each other from shrinkage in the X and Y dimensions during firing.

2. The composition according to claim 1, wherein when the layer of the dielectric material $M_2$ sinters at $T_2$, the shrinkage in the X and Y dimensions is prevented by the layer of dielectric material $M_1$, which does not shrink at $T_2$, and when the layer of dielectric material $M_1$ sinters at $T_1$, the shrinkage in the X and Y dimensions is prevented by the layer of dielectric material $M_2$, which has completed shrinkage.

3. The composition according to claim 1, wherein $T_1$ and $T_2$ range from about 450° C. to about 1200° C.

4. The composition according to claim 3, wherein $T_1$ and $T_2$ are below about 960° C.

* * * * *